(12) United States Patent
Stöhr et al.

(10) Patent No.: US 7,715,456 B2
(45) Date of Patent: May 11, 2010

(54) SEMICONDUCTOR LASER DEVICE

(75) Inventors: Detlef Stöhr, Castrop-Rauxel (DE); Daniel Bartoschewski, Gelsenkirchen (DE)

(73) Assignee: Limo Patentverwaltung GmbH & Co. KG, Gerstengrund (DE)

( * ) Notice: Subject to any disclaimer, the term of this patent is extended or adjusted under 35 U.S.C. 154(b) by 0 days.

(21) Appl. No.: 12/091,840

(22) PCT Filed: Oct. 27, 2005

(86) PCT No.: PCT/DE2005/001928

§ 371 (c)(1),
(2), (4) Date: Apr. 28, 2008

(87) PCT Pub. No.: WO2007/048362

PCT Pub. Date: May 3, 2007

(65) Prior Publication Data

US 2008/0225913 A1 Sep. 18, 2008

(51) Int. Cl.
*H01S 3/04* (2006.01)
(52) U.S. Cl. .......................... 372/36; 372/34
(58) Field of Classification Search .................. 372/34, 372/36
See application file for complete search history.

(56) References Cited

U.S. PATENT DOCUMENTS

| | | | |
|---|---|---|---|
| 6,827,505 B2 | 12/2004 | Shinde et al. | |
| 6,984,076 B2 * | 1/2006 | Walker et al. | 385/94 |
| 7,109,581 B2 * | 9/2006 | Dangelo et al. | 257/720 |
| 7,214,997 B2 | 5/2007 | Yamauchi | |
| 7,492,806 B2 * | 2/2009 | Day et al. | 372/101 |
| 2003/0147601 A1 * | 8/2003 | Bartur et al. | 385/92 |
| 2003/0231679 A1 * | 12/2003 | Umemoto et al. | 372/43 |
| 2004/0105472 A1 * | 6/2004 | Hosokawa et al. | 372/36 |
| 2004/0114884 A1 | 6/2004 | Shinde et al. | |
| 2004/0202212 A1 * | 10/2004 | Yamauchi | 372/36 |

FOREIGN PATENT DOCUMENTS

| | | |
|---|---|---|
| CN | 1508884 A | 6/2004 |
| CN | 1538411 A | 10/2004 |

OTHER PUBLICATIONS

Chinese Office Action dated Oct. 23, 2009.

* cited by examiner

*Primary Examiner*—Minsun Harvey
*Assistant Examiner*—Phillip Nguyen
(74) *Attorney, Agent, or Firm*—Laurence A. Greenberg; Werner H. Stemer; Ralph E. Locher

(57) ABSTRACT

A semiconductor laser device has at least one semiconductor laser element, a heat sink having a first bearing area, on which the at least one semiconductor laser element bears, a housing upper part and a housing lower part, which, in the interconnected state, can at least partly surround the semiconductor laser element, and also a sealing for the tight connection of housing upper part and housing lower part. The heat sink services as housing lower part.

25 Claims, 4 Drawing Sheets

SEMICONDUCTOR LASER DEVICE

BACKGROUND OF THE INVENTION

Field of the Invention

The present invention relates to a semiconductor laser device with at least one semiconductor laser element, a heat sink having a first bearing area on which the at least one semiconductor laser element bears a housing upper part and a housing lower part, which in the interconnected state, can at least partly surround the semiconductor laser element, and sealing means for the tight connection of the housing upper part and the housing lower part. The invention further relates to a semiconductor laser device with at least one semiconductor laser element and a heat sink on which the at least one semiconductor laser element can bear.

In order to realize a tightly closing housing in semiconductor laser devices of the aforementioned type, it is known from the prior art for the housing lower part to completely enclose the heat sink and the diode, a housing upper part then being placed onto said housing lower part. A construction of this type proves to be disadvantageous in terms of firstly the large space requirement of a device of this type and secondly an additional heat transfer below the heat sink.

Furthermore, heat sinks nowadays generally comprise copper. Copper has a different coefficient of thermal expansion than the common semiconductor laser elements composed of gallium arsenide. For this reason, hard soldering of the semiconductor laser element embodied as a laser diode bar, for example, on the heat sink is not possible.

BRIEF SUMMARY OF THE INVENTION

The problem on which the present invention is based is to provide a semiconductor laser device of the type mentioned in the introduction which requires less space. Furthermore, the present invention is based on the problem of providing a heat sink for a semiconductor laser device of the type mentioned in the introduction which enables hard soldering of the semiconductor laser element on the heat sink.

This is achieved according to the invention by means of a semiconductor laser device of the type mentioned in the introduction with added features.

One exemplary embodiment of the invention provides for the heat sink to serve as housing lower part. A configuration of this type obviates a separate housing lower part surrounding the heat sink. This results in a semiconductor laser device which takes up a smaller space.

In this case, there is the possibility that the heat sink comprises a second bearing area for the sealing means and/or for a third bearing area of the housing upper part, said third bearing area interacting with the sealing means.

In this case, the second bearing area can extend substantially in one plane.

Furthermore, there is a possibility that the housing upper part and the heat sink serving as housing lower part bear on one another and/or on the sealing means substantially in one plane.

It may be provided, in particular, that the first bearing area and the second bearing area form an angle not equal to 0° and not equal to 180°. By way of example, in this case, the angle between the first and second bearing areas can be between 3° and 15°, preferably between 5° and 10°, in particular approximately 8°. The angle between the first bearing area serving for the bearing of the semiconductor laser element and the second bearing area serving for the bearing of the upper part has the effect that the first bearing area is at a greater distance from the second bearing area in a direction of the area normal to the first bearing area at one of its sides than at the side opposite to this one side. The side at the greater distance will generally be the side at which the semiconductor laser element is fitted on the first bearing area. The angle between the first and second bearing areas thus produces, particularly ahead of the semiconductor laser element, a step or cut-out which leaves space for the mounting for example of optical means that the semiconductor laser device comprises. Said optical means can serve for influencing the laser radiation emerging from the at least one semiconductor laser element. Optical means of this type can be formed for example as fast-axis collimation lens.

It may be provided that the sealing means surround the first bearing area, in particular substantially in the plane of the second bearing area. By way of example, the sealing means can comprise an O-ring. In this case, it may be provided that the sealing means comprise a groove in the second bearing area and/or in the third bearing area for receiving the O-ring. In particular, in this case, the O-ring can surround the first bearing area. In this way, it is possible using simple means to achieve a good sealing between the housing upper part and the heat sink serving as housing lower part.

It may be provided, for example that the sealing means are configured in such a way that the tight connection between housing upper part and housing lower part ensures a leakage rate of less than $2 \cdot 10^{-6}$ mbar·l·s$^{-1}$ or less than $2 \cdot 10^{-7}$ N·m·s$^{-1}$, in particular a leakage rate of less than $1 \cdot 10^{-6}$ mbar·l·s$^{-1}$ or less than $1 \cdot 10^{-7}$ N·m·s$^{-1}$. It is apparent, therefore, that a comparatively low leakage rate can be realized with the sealing means.

One exemplary embodiment of the invention provides for the heat sink to have a coefficient of thermal expansion which corresponds to that of the at least one semiconductor laser element, in particular to that of gallium arsenide. In this way there is the possibility of applying the semiconductor laser element on the heat sink by means of a hard soldering.

One exemplary embodiment of the invention provides for the heat sink substantially to comprise ceramic, wherein the ceramic has in particular an admixture of carbon nanotubes (CNT). The ceramic can be in particular a ceramic which has a very high conductivity for current and heat in particular on account of the admixture of the carbon nanotubes. At the same time, the carbon nanotubes can have the effect that the ceramic also has a very high breaking strength. In particular, it is advantageous to set the coefficient of thermal expansion of such a ceramic used as heat sink in such a way that it corresponds to that of the semiconductor laser element, in particular to that of gallium arsenide.

Such a ceramic could be produced by admixing a suitable amount of carbon nanotubes in the powder used for producing the ceramic.

As an alternative, there is the possibility that the heat sink comprises copper or copper with CuWo.

Further features and advantages of the present invention will become clear on the basis of the following description of preferred exemplary embodiments with reference to the accompanying figures, in which:

DESCRIPTION OF THE INVENTION

Figure 1:
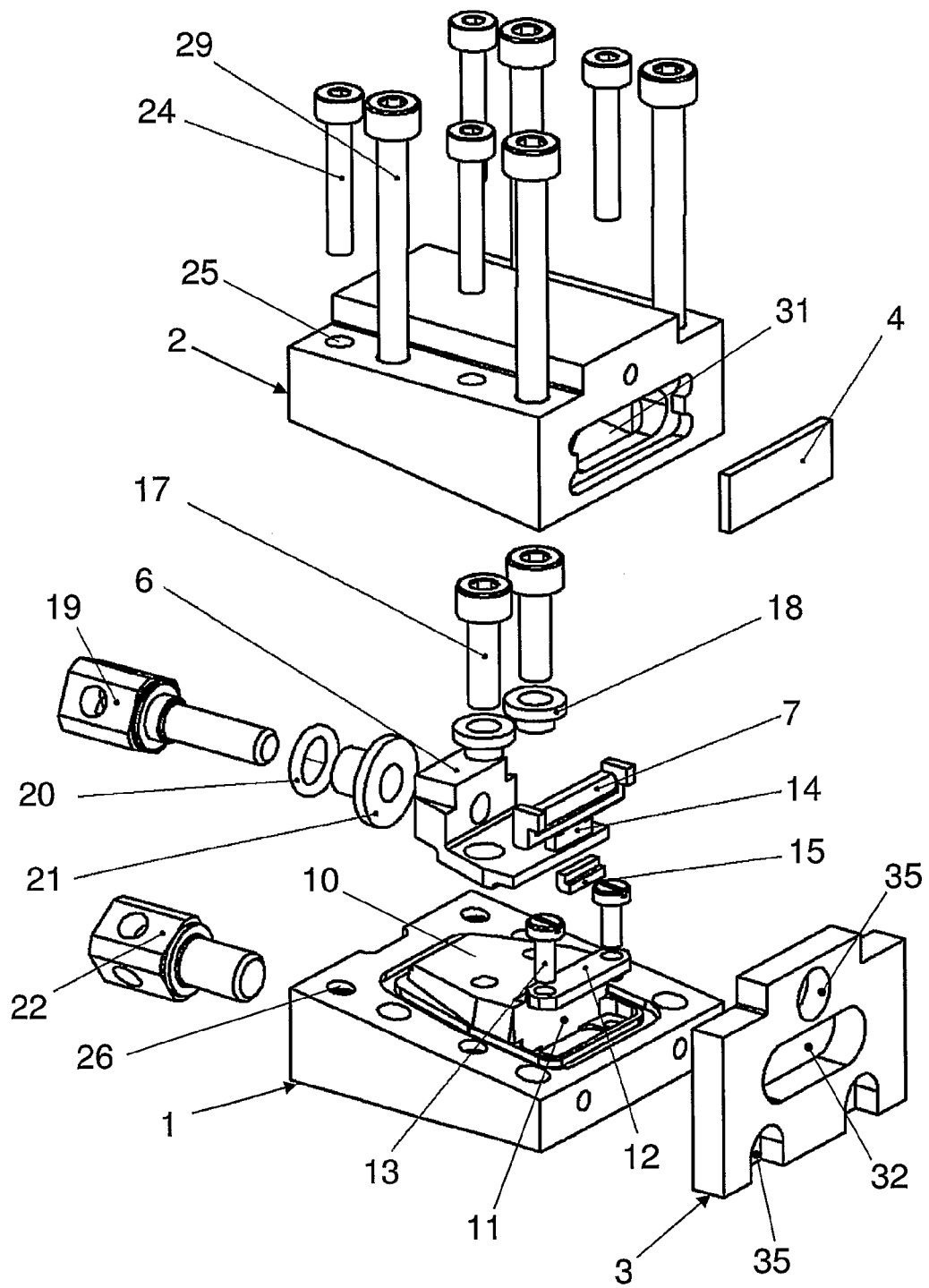
FIG. 1 shows an exploded illustration of a semiconductor laser device according to the invention.
Figure 2:
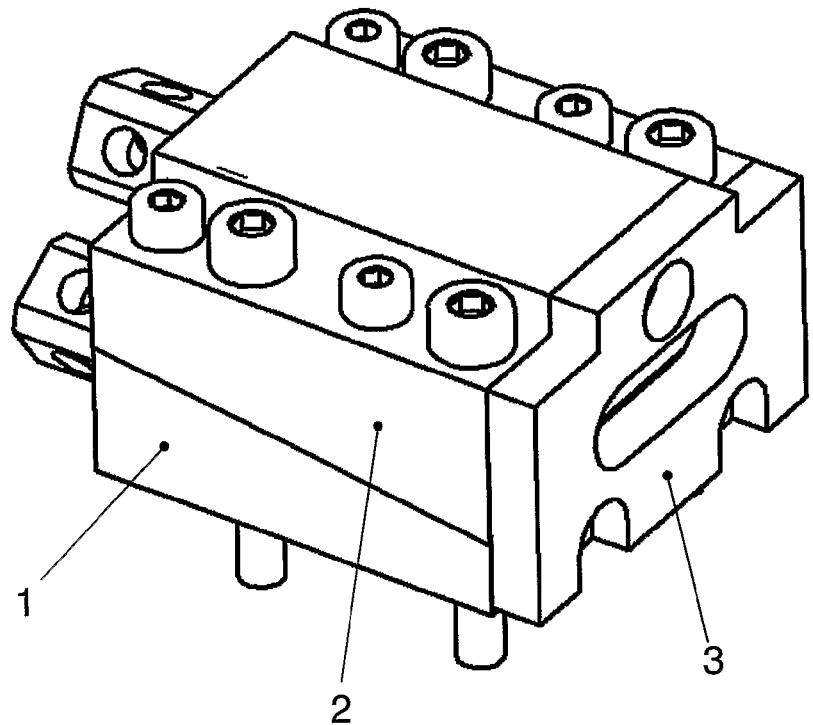
FIG. 2 shows a perspective view of the semiconductor laser device in accordance with FIG. 1.

It can be seen from FIG. 1 that a semiconductor laser device according to the invention comprises a heat sink 1 serving as housing lower part and a housing upper part 2, which can be connected to one another. Furthermore, the semiconductor laser device comprises a housing front plate 3, which can hold in particular an exit window 4. As an alternative, the exit window 4 can be integrated directly into the housing upper part 2. In addition, the semiconductor laser device represented comprises a semiconductor laser element 5 embodied for example as a laser diode bar (in this respect see FIG. 7, for example) and also mounting means for a cathode 6 and optical means, which are formed in particular as fast-axis collimation lens 7.

The heat sink 1 has a substantially square base area 8 and a second bearing area 9 at a distance from the latter. As can be seen from FIG. 9, in particular, the second bearing area 9 and the base area 8 form an angle α of approximately 8°, for example, with one another. In the side view in accordance with FIG. 9, therefore the second bearing area 9 slopes down somewhat from left to right, such that the heat sink 1 is formed approximately in wedge-shaped fashion in side view. The heat sink 1 therefore substantially represents an obliquely truncated parallelepiped.

Figure 4:
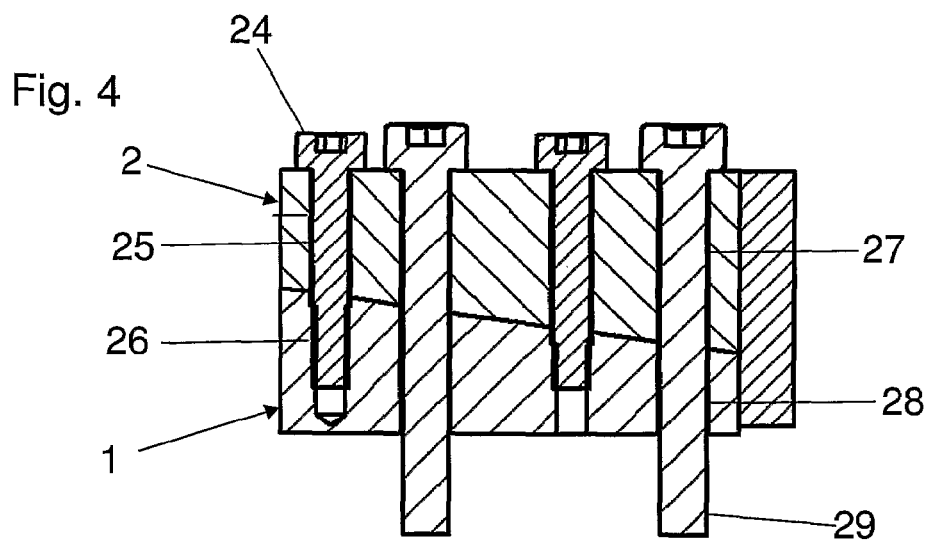
FIG. 4 shows a section in accordance with the arrows IV-IV in FIG. 6.

It can be seen from FIG. 4 that not only the heat sink 1 but also the housing upper part 2 represents an obliquely truncated parallelepiped. The top side is obliquely truncated in the case of the heat sink 1, whereas the underside is obliquely truncated in the case of the housing upper part 2.

The second bearing area 9 does not form the entire surface of the heat sink 1. Rather, a first bearing area 10 is provided in the central region of the top side of the heat sink 1, said first bearing area serving for the bearing of the semiconductor laser element 5. It can be seen from FIG. 3 and FIG. 7, in particular, that the semiconductor laser element is applied in an end region, namely in the right-hand end region of the first bearing area 10 in FIG. 7.

Figure 9:
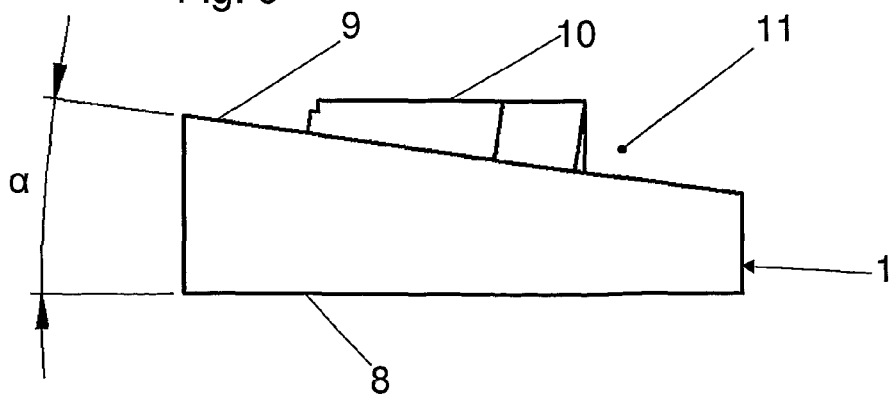
FIG. 9 shows a view in accordance with the arrow IX in FIG. 7.

As can be seen from FIG. 9, in particular, the first bearing area 10 is parallel to the base area 8 of the heat sink 1. For this reason, the first bearing area 10 also forms the abovementioned angle α with the second bearing area 9. On account of the angle between the first bearing area 10 and the second bearing area 9, a significantly larger vertical distance between the first and the second bearing area 9, 10 arises on the right-hand side of the first bearing area 9 in FIG. 9 than on the left-hand side of the first bearing area 10 in FIG. 9. Furthermore, the first bearing area 10 does not extend as far as the second bearing area 9 on the right-hand side in FIG. 9. Rather, between these two areas there is a distance that enables a horizontally and vertically extending mounting space 11. Said mounting space 11 can be seen from FIG. 3, FIG. 7 and FIG. 9, for example.

The mounting space 11 can serve for receiving the abovementioned mounting means. The mounting means can comprise a metal plate 12 which can be connected to the heat sink 1 by means of screws 13 in the region of the underside of the mounting space 11 (in this respect, see FIG. 1). A lens holder 14 can be placed onto the metal plate 12, said lens holder holding a fast-axis collimation lenses 7. The lens holder 14 and the metal plate 12 can be connected to one another via a bracket 15 for example by means of adhesive bonding, soldering or hard soldering.

Figure 3:
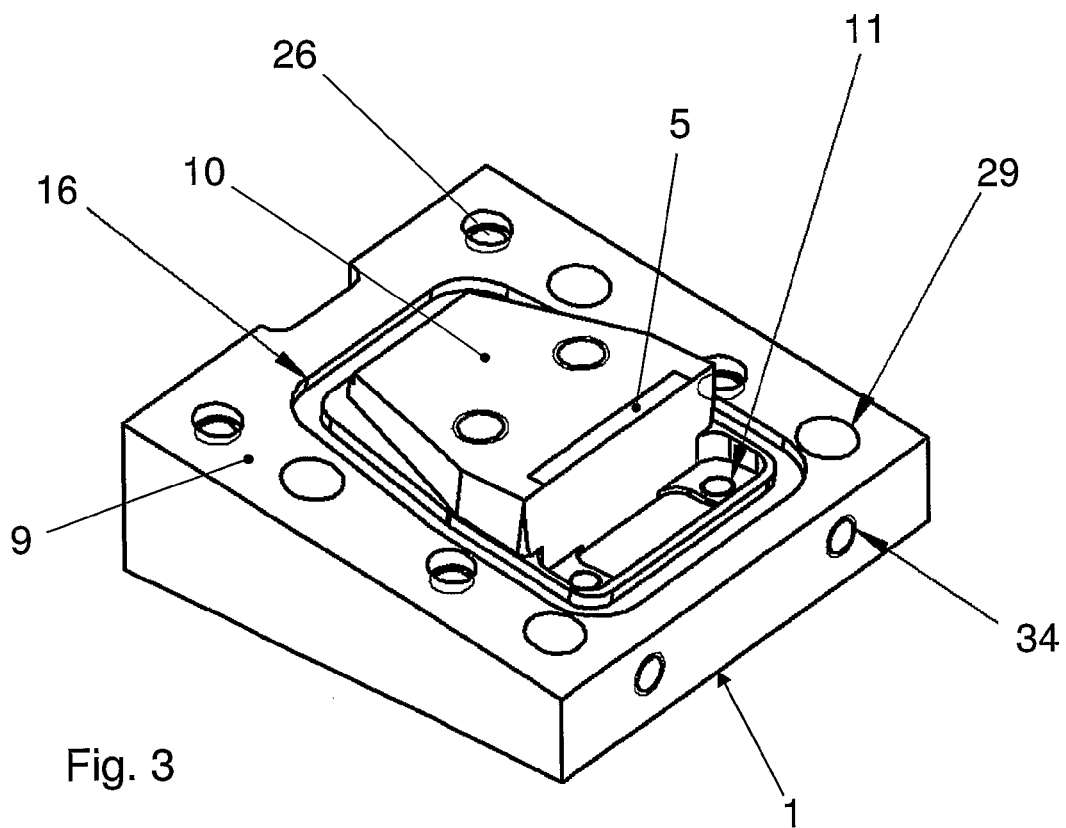
FIG. 3 shows a perspective view of the heat sink with a semiconductor laser element of the semiconductor laser device in accordance with FIG. 1.
Figure 7:
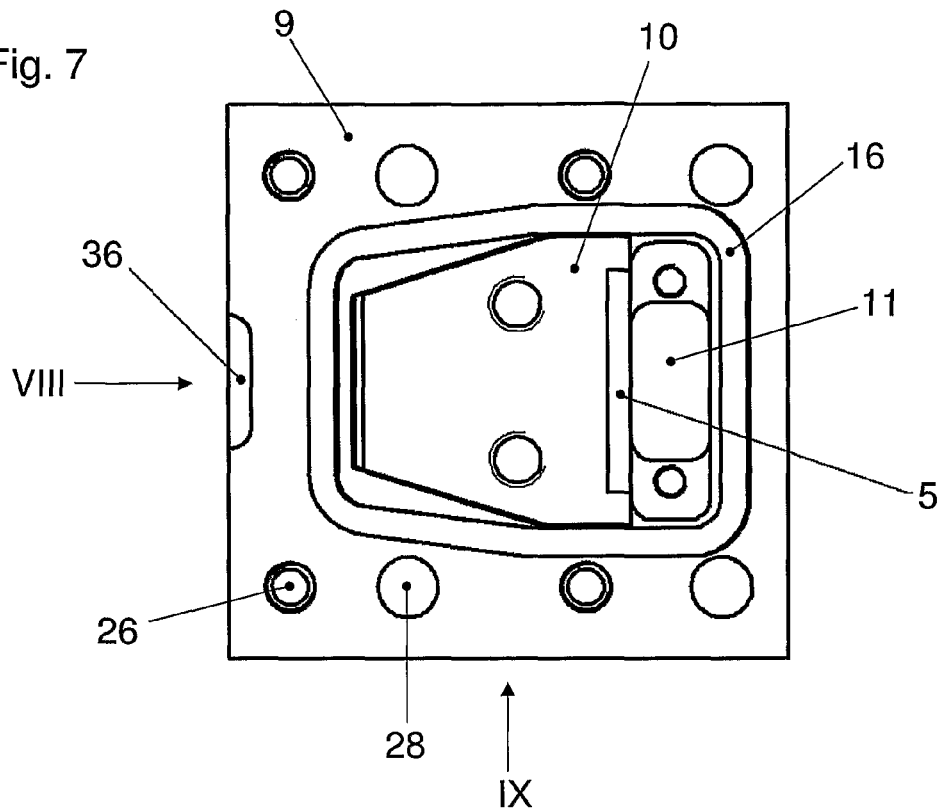
FIG. 7 shows a plan view of the heat sink with semiconductor laser device in accordance with FIG. 3.

It can be seen from FIG. 3 and FIG. 7 that a groove 16 for receiving an O-ring (not represented) is provided around the first bearing area 10 in the second bearing area 9. The O-ring bracket (not represented) therefore surrounds the first bearing area 10 and the mounting space 11 without interruption and can bear in sealing fashion on the underside of the housing upper part 2, said underside serving as third bearing area.

FIG. 1 furthermore reveals the cathode 6, which can be connected to the first bearing area 10 by means of screws 17 and insulating bushes 18. In this case, part of the underside of the cathode 6 makes contact with the top side of the semiconductor laser element 5. In particular, a nonconductive layer or a nonconductive material is provided between that underside of the cathode 6 which does not bear on the top side of the semiconductor laser element 5 and the top side of the bearing area 10.

The cathode 6 can be connected to an electrical connection 19 from the outside through the housing upper part 2. Said electrical connection 19 is insulated from the housing upper part 2 by means of an O-ring 20 and an insulating bush 21 (in this respect, see FIG. 1 and FIG. 5).

Furthermore, contact can be made with the top side—serving as an anode—of the first bearing area 10, to which the underside of the semiconductor laser element 5 is electrically conductively connected, by an electrical connection 22. The latter is for example simply screwed into a threaded hole 23 in the heat sink 1 (in this respect, see FIG. 8).

The housing upper part 2 and the heat sink 1 are connected to one another by screws 24; said screws 24 can for example project through holes 25 and be screwed into corresponding threaded holes 26 in the heat sink 1. Furthermore, both in the housing upper part 2 and in the heat sink 1 serving as housing lower part, continuous holes 27, 28 can be provided for screws 29, which can for example fixedly screw the entire semiconductor laser device to an apparatus (in this respect, see FIG. 1, FIG. 4 and FIG. 7 for example).

Figure 5:
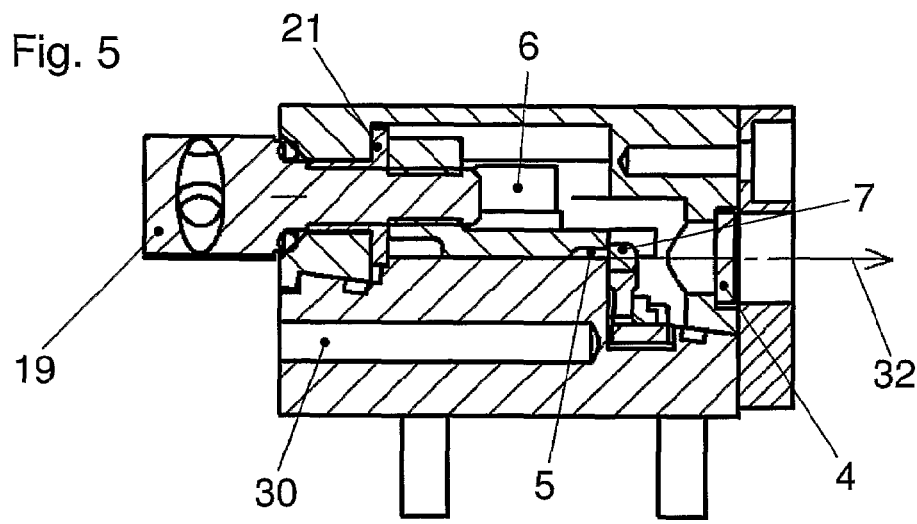
FIG. 5 shows a section in accordance with the arrows V-V in FIG. 6.
Figure 6:
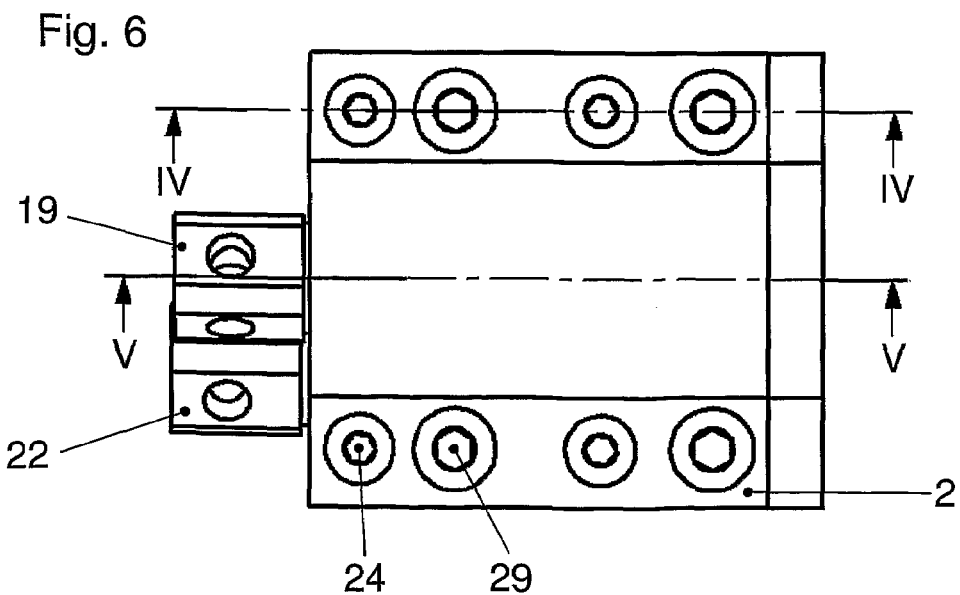
FIG. 6 shows a plan view of the semiconductor laser device in accordance with FIG. 1.
Figure 8:
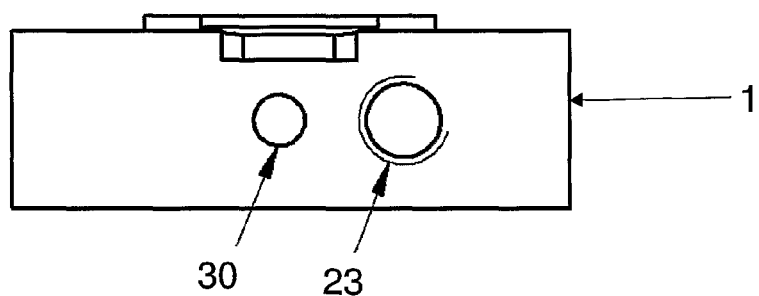
FIG. 8 shows a view in accordance with the arrow VIII in FIG. 7.

FIG. 5 and FIG. 8 furthermore reveal a hole 30 in the heat sink 1 which serves as a receptacle for sensor means.

It can furthermore be seen from FIG. 1 that the housing upper part 2 has an opening 31 for the passage of the laser radiation 32 emerging from the semiconductor laser element 5 (in this respect, also see FIG. 5). The window 4 can be introduced into the opening 31. Furthermore, the housing front plate 3 also has an opening 33 for passage of the laser radiation 32.

The housing front plate 3 can be connected to the heat sink 1 by screws (not represented). In particular, for this purpose corresponding threaded holes 34 can be provided on the front side of the heat sink 1 and/or of the housing upper part 2. Said screws can project through corresponding openings or holes 35 in the front plate 3.

On the left-hand side of the heat sink 1 in FIG. 7, a holding groove 36 is provided in the second bearing area 9, which holding groove can serve for the engagement of fixing means. In particular, said holding groove 36 serves as a corresponding receptacle for a lug arranged on the housing upper part 2. The engagement of the lug into the holding groove 36 prevents the housing upper part 2 from slipping off in the course of securing it on the heat sink 1 by screwing.

The heat sink 1 can comprise a ceramic material completely or at least in sections. In particular, it is possible to use a ceramic material with which carbon nanotubes have been admixed. Such a ceramic can be produced by admixing carbon nanotubes in the powder serving as starting material for the production of the ceramic.

Such a ceramic can have a very high thermal and electrical conductivity. Furthermore, it can also have a very high breaking strength on account of the carbon nanotubes. In particular, it proves to be advantageous if the coefficient of thermal expansion of such a heat sink 1 produced from ceramic corresponds to that of the semiconductor laser element 5, and in particular to that of gallium arsenide. In this way, there is the possibility of connecting the semiconductor laser element 5 to the heat sink 1 or the first bearing area 10 of the heat sink 1 by hard soldering.

The invention claimed is:

1. A semiconductor laser device, comprising
   at least one semiconductor laser element;
   a heat sink having a first bearing area including a surface bearing against said at least one semiconductor laser element;
   a housing including a housing upper part and said heat sink forming a housing lower part, said housing upper part and said heat sink, in an interconnected state thereof, at least partly surrounding said semiconductor laser element; and
   sealing means for tightly connecting said housing upper part and said heat sink forming said housing lower part;
   said heat sink formed with a second bearing area including a surface; and
   wherein an imaginary plane running through said surface of said first bearing area and an imaginary plane running through said surface of said second bearing area intersect and form an angle between 3° and 15°.

2. The semiconductor laser device according to claim 1, wherein said heat sink is formed with a third bearing area of said housing upper part, said third bearing area interacting with said sealing means, said second bearing area for said sealing means.

3. The semiconductor laser device according to claim 2, wherein said second bearing area extends substantially in one plane.

4. The semiconductor laser device according to claim 1, wherein said housing upper part is supported on said heat sink serving as said housing lower part.

5. The semiconductor laser device according to claim 1, wherein the angle is between 5° and 10°.

6. The semiconductor laser device according to claim 1, wherein the angle is approximately 8°.

7. The semiconductor laser device according to claim 1, wherein said sealing means surround said first bearing area.

8. The semiconductor laser device according to claim 7, wherein said sealing means surround said first bearing area substantially in a plane of said second bearing area.

9. The semiconductor laser device according to claim 1, wherein said sealing means comprise an O-ring.

10. The semiconductor laser device according to claim 9, wherein said sealing means further comprise a groove formed in at least one of said second bearing area and a third bearing area of said housing upper part for receiving said O-ring.

11. The semiconductor laser device according to claim 9, wherein said O-ring surrounds said first bearing area.

12. The semiconductor laser device according to claim 1, which further comprises optical means for influencing a laser radiation emerging from said at least one semiconductor laser element.

13. The semiconductor laser device according to claim 12, wherein said optical means include at least one fast-axis collimation lens.

14. The semiconductor laser device according to claim 12, which comprises mounting means for mounting said optical means.

15. The semiconductor laser device according to claim 12, wherein an interspace is formed between said first bearing area and said second bearing area, at least in a region adjacent said at least one semiconductor laser element, said interspace providing a space for mounting said optical means.

16. The semiconductor laser device according to claim 1, wherein said sealing means are configured to ensure a tight connection between said housing upper part and said housing lower part to ensure a leakage rate of less than $2 \cdot 10^{-6}$ mbar·l·s$^{-1}$.

17. The semiconductor laser device according to claim 16, wherein said sealing means are configured to ensure a leakage rate of less than $2 \cdot 10^{-7}$ mbar·l·s$^{-1}$.

18. The semiconductor laser device according to claim 16, wherein said sealing means are configured to ensure a leakage rate of less than $1 \cdot 10^{-6}$ mbar·l·s$^{-1}$.

19. The semiconductor laser device according to claim 16, wherein said sealing means are configured to ensure a leakage rate of less than $1 \cdot 10^{-7}$ N·m·s$^{-1}$.

20. A semiconductor laser device, comprising:
    at least one semiconductor laser element having a coefficient of thermal expansion;
    a heat sink having a coefficient of thermal expansion corresponding to the coefficient of thermal expansion of said at least one semiconductor laser element;
    said heat sink having a first bearing area including a surface bearing against said at least one semiconductor laser element;
    said heat sink having a second bearing area including a surface; and
    wherein an imaginary plane running through said surface of said first bearing area and an imaginary plane running through said surface of said second bearing area intersect and form an angle between 3° and 15°.

21. The semiconductor laser device according to claim 20, wherein the coefficient of thermal expansion of said heat sink corresponds to the coefficient of thermal expansion of gallium arsenide.

22. The semiconductor laser device according to claim 20, wherein said heat sink essentially consists of a ceramic.

23. The semiconductor laser device according to claim 22, wherein said ceramic includes an admixture of carbon nanotubes.

24. A semiconductor laser device, comprising:
    at least one semiconductor laser element;
    a heat sink bearing consisting essentially of ceramic;
    said heat sink having a first bearing area including a surface bearing against said at least one semiconductor laser element;
    said heat sink having a second bearing area including a surface; and
    wherein an imaginary plane running through said surface of said first bearing area and an imaginary plane running through said surface of said second bearing area intersect and form an angle between 3° and 15°.

25. The semiconductor laser device according to claim 24, wherein said ceramic includes an admixture of carbon nanotubes.

* * * * *